United States Patent
Hsiao

(10) Patent No.: US 9,891,642 B2
(45) Date of Patent: Feb. 13, 2018

(54) CURRENT SOURCE AND CURRENT SUPPLY SYSTEM WITH HYSTERESIS

(71) Applicant: NOVATEK Microelectronics Corp., Hsin-Chu (TW)

(72) Inventor: Sheng-Wen Hsiao, Changhua County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 47 days.

(21) Appl. No.: 14/790,006

(22) Filed: Jul. 2, 2015

(65) Prior Publication Data

US 2017/0003697 A1   Jan. 5, 2017

(51) Int. Cl.
  *G05F 3/24* (2006.01)
  *G05F 1/56* (2006.01)
  *G05F 3/20* (2006.01)

(52) U.S. Cl.
  CPC .............. *G05F 1/56* (2013.01); *G05F 3/205* (2013.01); *G05F 3/242* (2013.01); *H03F 2200/15* (2013.01); *H03F 2203/45244* (2013.01)

(58) Field of Classification Search
  CPC ... G05F 3/20; G05F 3/205; G05F 3/24; G05F 3/26; G05F 3/262; G05F 3/242; H03F 2203/45154; H03F 2203/45244; H03F 2200/21; H03F 2200/27; H03F 2200/15
  See application file for complete search history.

(56) References Cited

U.S. PATENT DOCUMENTS

| | | | | |
|---|---|---|---|---|
| 4,360,785 A | * | 11/1982 | Schade, Jr. | ........... H03F 3/4508 330/253 |
| 6,208,174 B1 | * | 3/2001 | Hopkins | ............... H03F 3/3023 327/65 |
| 6,307,415 B1 | * | 10/2001 | Phillips | ................... G04F 1/005 327/205 |
| 2007/0247174 A1 | * | 10/2007 | Abdelli | .............. G01R 19/1659 324/705 |
| 2011/0086594 A1 | * | 4/2011 | McElwee | ................ H03F 1/301 455/73 |

* cited by examiner

*Primary Examiner* — Harry Behm
(74) *Attorney, Agent, or Firm* — Winston Hsu

(57) ABSTRACT

A current source with hysteresis for an output circuit includes a tail current transistor, a resistor and a differential pair. The tail current transistor is used for supplying a current to the output circuit. The resistor is coupled to a drain terminal of the tail current transistor. The differential pair, coupled to the resistor, is used for controlling a magnitude of the current supplied to the output circuit. The differential pair includes a first transistor, of which a bulk terminal is coupled to a terminal of the resistor; and a second transistor, of which a bulk terminal is coupled to another terminal of the resistor.

8 Claims, 4 Drawing Sheets

CURRENT SOURCE AND CURRENT SUPPLY SYSTEM WITH HYSTERESIS

BACKGROUND OF THE INVENTION

1. Field of the Invention

The present invention relates to a current source and a current supply system, and more particularly, to a current source and a current supply system with hysteresis.

2. Description of the Prior Art

In a common low dropout (LDO) regulator, a control circuit is disposed to maintain the LDO's output voltage when a load arrives. For the control circuit, it is desirable to have a rapid response and low power consumption. However, there is a tradeoff between the response speed and power consumption. With a higher bias current, the control circuit may respond faster but consume more power. With a lower bias current, the control circuit may have less power consumption, which is accompanied by lower response speed.

An adaptive bias current source is therefore applied to achieve high response speed and low power consumption simultaneously. The adaptive bias current source may detect the status of an output circuit and supply a larger current only when the output circuit requires a faster response, e.g., when a load variation occurs in an LDO regulator. In other words, the adaptive bias current source is capable of detecting the status of the output circuit and accordingly supplying adaptive bias currents to the output circuit such as an LDO regulator, an amplifier or a buffer. However, if the adaptive bias current source is excessively sensitive to the status of the output circuit, the output circuit may become unstable since the current supplied by the adaptive bias current source always varies. Thus, the adaptive bias current source is always implemented with hysteresis characteristics, to avoid the stability problem.

Please refer to FIG. 1, which is a schematic diagram of a common current source 10 with hysteresis. The current source 10 includes a tail current transistor mbn1 and a differential pair, which includes transistors mn1 and mn2. The tail current transistor mbn1 receives a bias voltage VBN to generate a tail current I1 to be supplied to an output circuit. The transistors mn1 and mn2 respectively receive an output voltage VOUT and an input voltage VIN of the output circuit, to detect the status of the output circuit. Hysteresis is achieved by applying different width/length ratios (W/L) in the transistors mn1 and mn2, as denoted by:

$$(W/L)_1 = \alpha(W/L)_2. \quad (1)$$

wherein $\alpha$ is a positive constant other than 1, and $(W/L)_1$ and $(W/L)_2$ are width/length ratios of the transistors mn1 and mn2, respectively.

The hysteresis effect of the current source 10 may be determined by the drain current formula of a metal oxide semiconductor field-effect transistor (MOSFET), i.e., $I_D = K'(W/L) \times (V_{gs}-V_{th})^2$, which is described as follows:

$$I_{D1} = K'(W/L)_1 \times Vov1^2; \quad I_{D2} = K'(W/L)_2 \times Vov2^2; \quad (2)$$

wherein $I_{D1}$ and $I_{D2}$ are drain currents of the transistors mn1 and mn2, respectively, K' is a constant, and Vov1 and Vov2, which equal to the gate-source voltage ($V_{gs}$) minus the threshold voltage ($V_{th}$), are overdrive voltages of the transistors mn1 and mn2, respectively. When |VOUT−VIN|=0 and Vov1=Vov2, Equation (2) is substituted by Equation (1) to obtain:

$$I_{D1} = \alpha I_{D2}. \quad (3)$$

According to the above equations, the transition point of the voltages |VOUT−VIN| may be calculated to be equal to |VOUT−VIN|=[(1+α)^{1/2}−1] Vov. As can be seen, the hysteresis effect in the current source 10 is determined by the value of the overdrive voltage of the transistors mn1 and mn2 in the differential pair. In general, considering the static power consumption, the current source 10 is preferably designed to possess a low static current. Therefore, the transistors mn1 and mn2 may have low overdrive voltages, e.g., 20 mV, or may even be operated in the sub-threshold region. In such a condition, since the overdrive voltages of the transistors mn1 and mn2 are quite small, the current source 10 may have a poor hysteresis effect, and the adaptive range of hysteresis is also small.

The output circuit, such as the LDO regulator or the buffer, implemented with the current source 10 may easily become unstable due to the poor hysteresis effect of the current source. Thus, there is a need for improvement over the prior art.

SUMMARY OF THE INVENTION

It is therefore an objective of the present invention to provide a current source and a current supply system with a satisfactory hysteresis performance and wider adaptive range.

The present invention discloses a current source with hysteresis for an output circuit. The current source comprises a first tail current transistor, a first resistor and a first differential pair. The first tail current transistor is used for supplying a first current to the output circuit. The first resistor is coupled to a drain terminal of the first tail current transistor. The first differential pair, coupled to the first resistor, is used for controlling a magnitude of the first current supplied to the output circuit. The first differential pair comprises a first transistor, of which a bulk terminal is coupled to a terminal of the first resistor; and a second transistor, of which a bulk terminal is coupled to another terminal of the first resistor.

The present invention further discloses a current supply system with hysteresis. The current supply system comprises an output circuit, a first current source, a second current source, a first current mirror and a second current mirror. The first current source comprises a first tail current transistor, for supplying a first current to the output circuit; a first resistor, coupled to a drain terminal of the first tail current transistor; and a first differential pair, coupled to the first resistor, for controlling a magnitude of the first current supplied to the output circuit. The first differential pair comprises a first transistor, of which a bulk terminal is coupled to a terminal of the first resistor; and a second transistor, of which a bulk terminal is coupled to another terminal of the first resistor. The second current source comprises a second tail current transistor, for supplying a second current to the output circuit; a second resistor, coupled to a drain terminal of the second tail current transistor; and a second differential pair, coupled to the second resistor, for controlling a magnitude of the second current supplied to the output circuit. The second differential pair comprises a third transistor, of which a bulk terminal is coupled to a terminal of the second resistor; and a fourth transistor, of which a bulk terminal is coupled to another terminal of the second resistor. The first current mirror, coupled between a drain terminal of the first transistor, a drain terminal of the third transistor and the output circuit, is used for outputting a basic current to the output circuit by receiving the first current and the second current. The second current mirror, coupled between a drain terminal of the second transistor, a drain terminal of the fourth transistor and the output circuit, is used for outputting an additional current to the output circuit in addition to the basic current when a difference between the output voltage and the input voltage is greater than a threshold.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
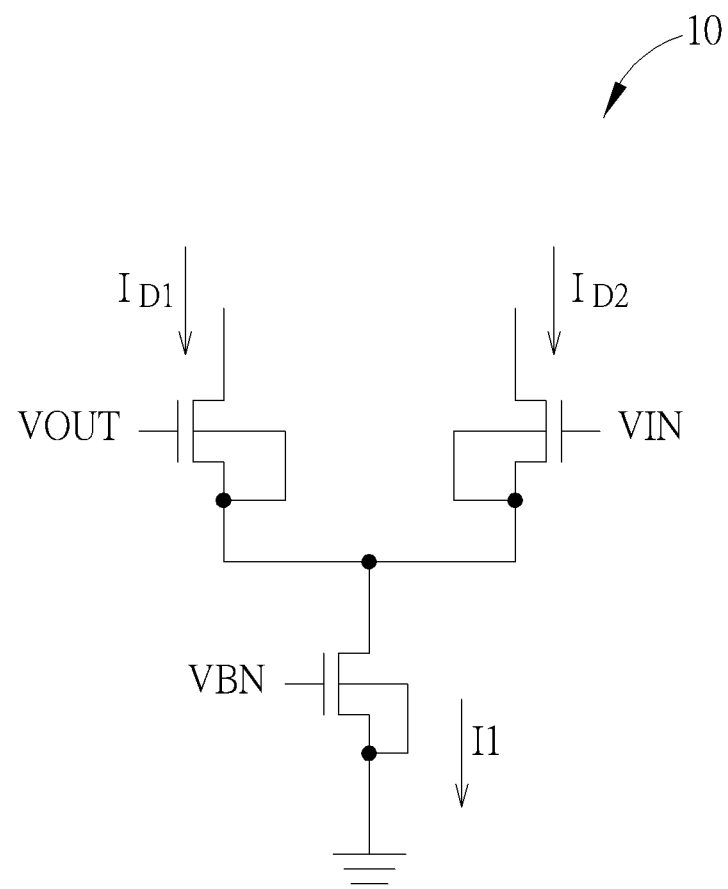
FIG. 1 is a schematic diagram of a common current source with hysteresis.
Figure 2:
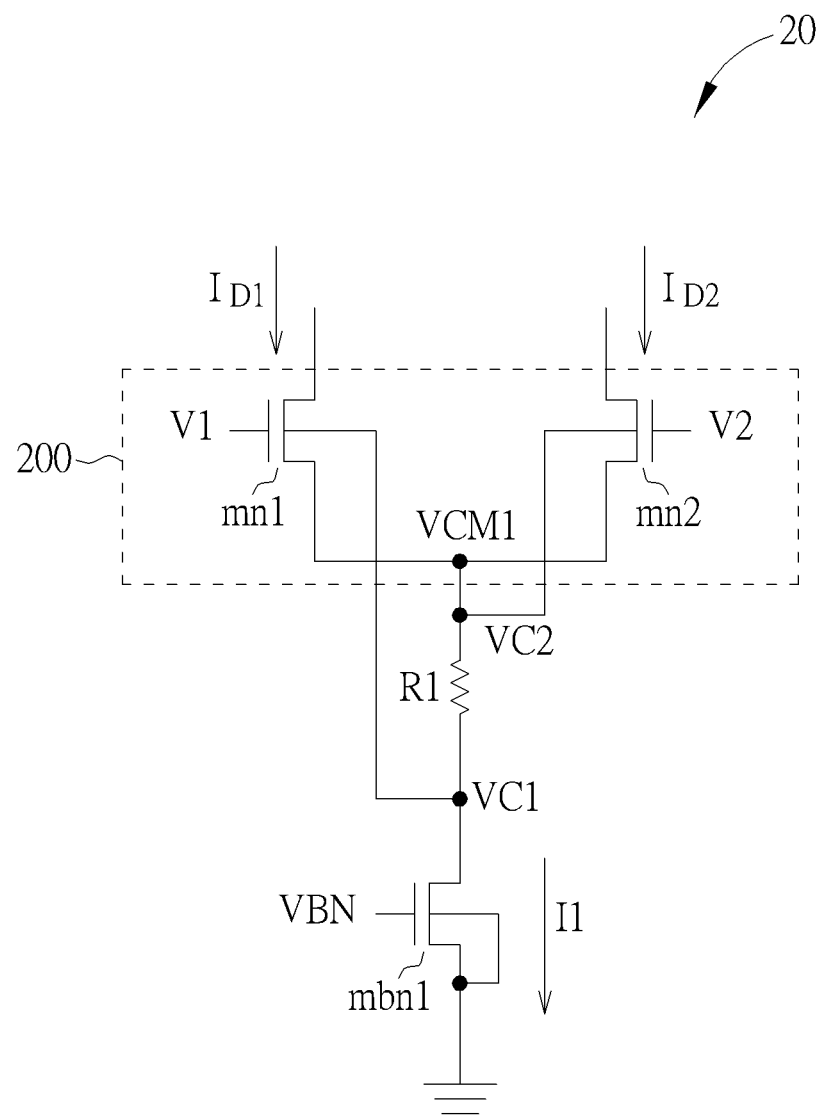
FIG. 2 is a schematic diagram of a current source with hysteresis according to an embodiment of the present invention.

Please refer to FIG. 2, which is a schematic diagram of a current source 20 with hysteresis according to an embodiment of the present invention. As shown in FIG. 2, the circuit structure of the current source 20 is similar to the circuit structure of the current source 10, so circuit elements and signals with similar functions are denoted by the same symbols. In detail, the current source 20 includes a tail current transistor mbn1, a resistor R1 and a differential pair 200. The tail current transistor mbn1 supplies a current I1 to the output circuit by receiving a bias voltage VBN. The resistor R1 is coupled to the drain terminal of the tail current transistor mbn1. The differential pair 200, coupled to the resistor R1, is used for controlling the magnitude of the current I1 supplied to the output circuit. The differential pair 200 includes transistors mn1 and mn2. The buck terminal of the transistor mn1 is coupled to a terminal of the resistor R1, and the buck terminal of the transistor mn2 is coupled to another terminal of the resistor R1. In addition, the gate terminal of the transistor mn1 receives a first voltage V1 of the output circuit, and the gate terminal of the transistor mn2 receives a second voltage V2 of the output circuit. In this manner, the currents outputted to the output circuit may be controlled by the difference between the first voltage V1 and the second voltage V2.

Different from the common current source 10 where the hysteresis is generated from different width/length ratios in the differential pair, in the current source 20, the hysteresis is realized by serially connecting the resistor R1 to the tail current transistor mbn1 and connecting the bulk terminals of the transistors mn1 and mn2 to different terminals of the resistor R1. In this manner, the hysteresis range may be controlled by the resistance value of the resistor R1, and the current source 20 may possess a better hysteresis effect and a wider adaptive range.

Consider the drain current formula of a metal oxide semiconductor field-effect transistor (MOSFET) as follows:

$$I_D = K'(W/L) \times (V_{gs} - V_{th})^2; \quad (4)$$

$$V_{th} = V_{th0} + \gamma[(2\Phi_f + V_{sb})^{1/2} - (2\Phi_f)^{1/2}]^{1/2}; \quad (5)$$

wherein $I_D$ is the drain current of the transistor mn1 or mn2, K' is a constant, (W/L) is the width/length ratio of the transistor mn1 or mn2, $V_{gs}$ is the gate-source voltage of the transistor mn1 or mn2, $V_{th}$ is the threshold voltage of the transistor mn1 or mn2, $V_{th0}$, $\gamma$ and $\Phi_f$ are parameters of the body effect, and $V_{sb}$ is the source-buck voltage of the transistor mn1 or mn2. Due to the circuit structure of the current source 20, the source-buck voltage $V_{sb}$ may be calculated as follows:

$$V_{sb1} = VCM1 - VC1;$$

$$V_{sb2} = VCM1 - VC2;$$

wherein VCM1 is the voltage on the common source terminal of the differential pair 200, VC1 is the voltage on a terminal of the resistor R1 where the bulk terminal of the transistor mn1 is connected, and VC2 is the voltage on another terminal of the resistor R2 where the bulk terminal of the transistor mn2 is connected.

According to the above equations, the transition point of the voltages |V2−V1| may be calculated to be equal to |V2−V1|=$\Delta V_{th}$, wherein Vov is the overdrive voltage of the transistor mn1 or mn2, and $\Delta V_{th}$ is equal to |$V_{th1} - V_{th2}$|. As can be seen, the hysteresis effect in the current source 20 is only determined by the difference between the threshold voltages $V_{th1}$ and $V_{th2}$ of the transistors mn1 and mn2, respectively. The values of the threshold voltages $V_{th1}$ and $V_{th2}$ are determined according to the body effect where the bulk terminals of the transistors mn1 and mn2 are connected to different terminals. More specifically, the difference of the threshold voltages $V_{th1}$ and $V_{th2}$ may be controlled by adjusting the value of the resistor R1. In a preferable embodiment, the resistor R1 may be a variable resistor, so the resistance value of the variable resistor may be controlled to adjust the hysteresis effect of the current source 20.

Please note that, in the current source 20, the bulk terminals of the transistors mn1 and mn2 are connected in the tail current branch rather than biased by other voltage sources. Power consumption is thereby saved since there is no redundant voltage source. In addition, since the bulk voltages of the transistors mn1 and mn2 are not fixed on specific bias voltages, the current source 20 is more adaptive to the received first voltage V1 and second voltage V2. For example, with a higher first voltage V1 and second voltage V2 received and detected by the current source 20, all of the voltages VCM1, VC1 and VC2 may rise accordingly, to be adapted to the higher first voltage V1 and second voltage V2.

In an embodiment, the output circuit may be a low dropout (LDO) regulator, and the current source 20 receives the output voltage and the input voltage of the LDO regulator, to detect load variations which change the output voltage of the LDO regulator. That is, the first voltage V1 and the second voltage V2 may be the output voltage and the input voltage of the output circuit, respectively, so that the current source 20 may output currents to the LDO regulator according to the voltage difference between the output voltage and the input voltage of the LDO regulator. For example, when the output voltage of the LDO regulator falls, the current source 20 may detect the falling and output a larger current to the control circuit of the LDO regulator, in order to increase the response speed of the control circuit, which allows the output voltage to rise back more rapidly.

Figure 3:
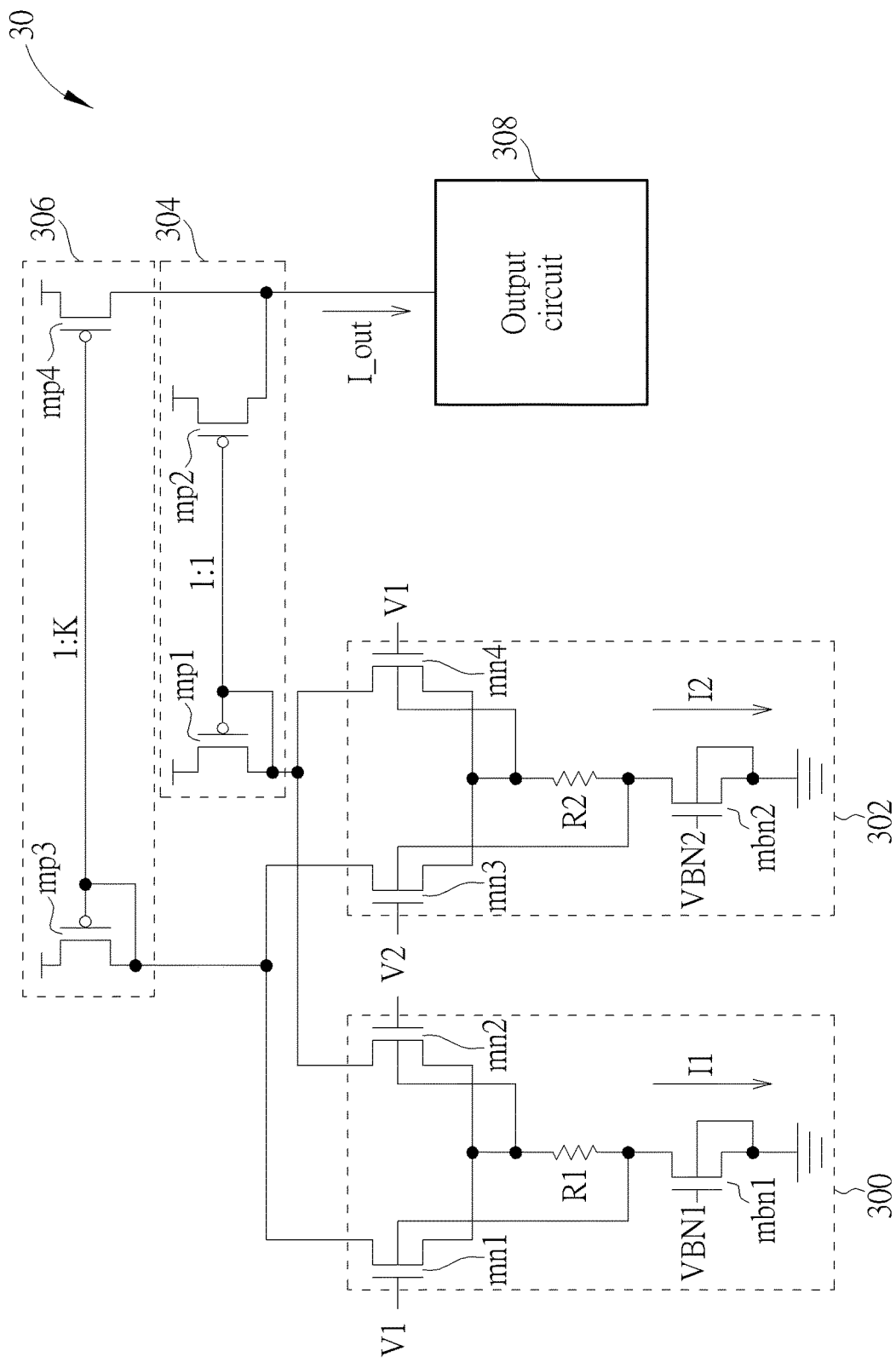
FIG. 3 is a schematic diagram of a current supply system according to an embodiment of the present invention.

Note that a current source may be incorporated with another current source to construct a current supply system. Please refer to FIG. 3, which is a schematic diagram of a current supply system 30 according to an embodiment of the present invention. The current supply system 30 includes current sources 300 and 302, current mirrors 304 and 306, and an output circuit 308. The circuit structure of the current sources 300 and 302 is similar to the circuit structure of the current source 20, so circuit elements and signals with similar functions are denoted by similar symbols. In detail, the current source 300 includes a tail current transistor mbn1, a resistor R1 and a differential pair, which includes transistors mn1 and mn2. The current source 302 includes a tail current transistor mbn2, a resistor R2 and a differential pair, which includes transistors mn3 and mn4. The tail current transistors mbn1 and mbn2 receive bias voltages VBN1 and VBN2, respectively, to output currents I1 and I2 to the output circuit 308. The current mirror 304, including transistors mp1 and mp2, is coupled between the drain terminal of the transistor mn2, the drain terminal of the transistor mn4 and the output circuit, for outputting a basic current to the output circuit by receiving the currents I1 and I2. The current mirror 306, including transistors mp3 and mp4, is coupled between the drain terminal of the transistor mn1, the drain terminal of the transistor mn3 and the output circuit, for outputting an additional current to the output circuit in addition to the basic current when the difference between the first voltage V1 and the second voltage V2 is greater than a threshold V_diff. The transistors mn1 and mn4 receives the first voltage V1, and the transistors mn2 and mn3 receives the second voltage V2, so that the current sources 300 and 302 may detect the status of the output circuit by receiving the first voltage V1 and the second voltage V2.

In an embodiment, both of the currents I1 and I2 may be equal to a value, e.g., I. The width/length ratios of the transistors mp1 and mp2 in the current mirror 304 is equal, so the current mirror 304 may output a current 2I (i.e., a sum of values of the currents I1 and I2) to the output circuit 308. In addition, the width/length ratios of the transistors mp3 and mp4 in the current mirror 306 may be of a ratio 1:K, K>1, so the current mirror 306 may output a current K×I to the output current 308.

Figure 4:
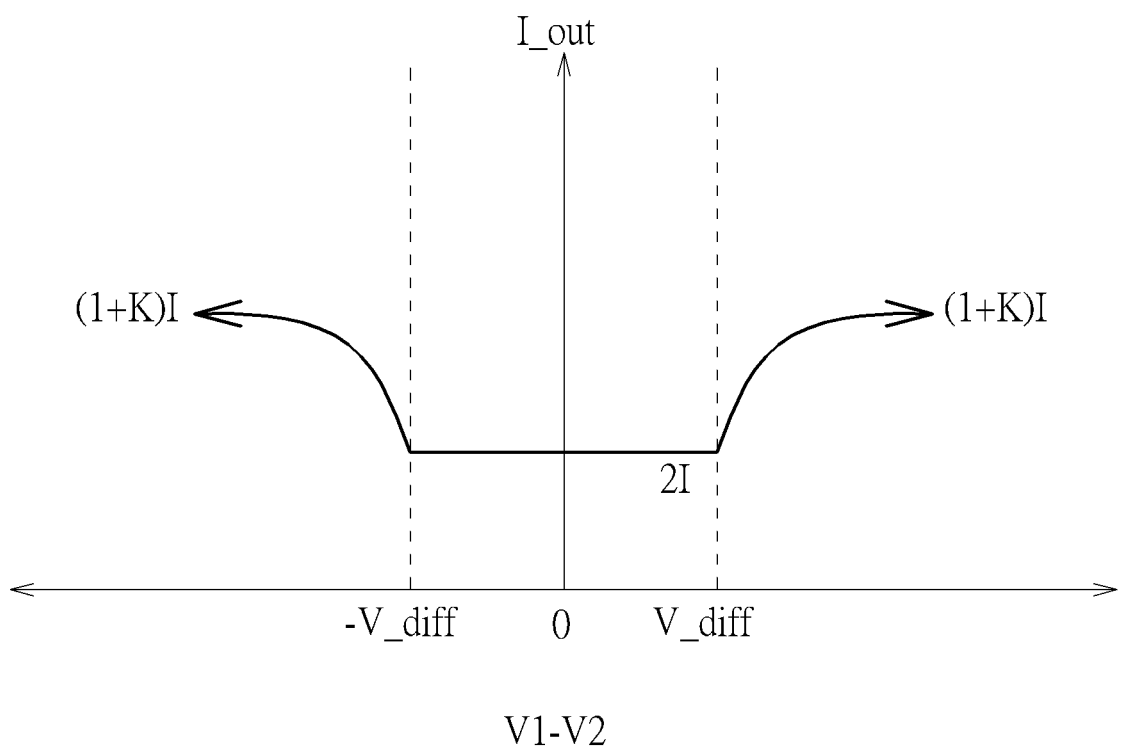
FIG. 4 is a schematic diagram of relations between the output current of the current supply system and the difference of the first voltage and the second voltage.

Please refer to FIG. 4, which is a schematic diagram of relations between the output current I_out of the current supply system 30 and the difference of the first voltage V1 and the second voltage V2. In the circuit structure of the current supply system 30, the current I1 or I2 flows to the current mirror 306 when the voltage difference is greater than the threshold V_diff, so the output current I_out starts to increase when the difference between the first voltage V1 and the second voltage V2 exceeds the threshold V_diff, as shown in FIG. 4. The value of the output current I_out remains in 2I when the difference of the first voltage V1 and the second voltage V2 is within the threshold V_diff, and increases toward (1+K)I when the difference of the first voltage V1 and the second voltage V2 increases more and departs from the threshold V_diff.

More specifically, when the difference of the first voltage V1 and the second voltage V2 is within the threshold V_diff, the current I1 may flow through the transistor mn2 and the current I2 may flow through the transistor mn4 due to the bulk connections in the differential pairs. In such a condition, both of the currents I1 and I2 flow to the current mirror 304, which outputs the basic current with a value equal to 2I. When the first voltage V1 increases and/or the second voltage V2 decreases to let the difference larger than the threshold V_diff, i.e., V1−V2>V_diff, a part of the current I1 flows to the current mirror 306 and the output current I_out starts to increase. If the difference increases to an extreme value, all of the current I1 may be transferred to flow through the transistor mn1, and the current I2 still flows through the transistor mn4. Therefore, the value of the output current I_out will increase to (1+K)I. When the first voltage V1 decreases and/or the second voltage V2 increases to let the difference larger than the threshold V_diff, i.e., V1−V2<−V_diff, a part of the current I2 flows to the current mirror 306 and the output current I_out starts to increase. If the difference increases to an extreme value, all of the current I2 may be transferred to flow through the transistor mn3, and the current I1 still flows through the transistor mn2. Therefore, the value of the output current I_out will increase to (1+K)I.

As a result, the total current I_out outputted to the output circuit 308 ranges from 2I to (1+k)I according to the detected voltage, so that the adaptive bias current source and current supply system is realized. In addition, since the current supply system outputs a constant current when the voltage difference is within the threshold V_diff, the hysteresis effect is thereby realized. Further, the threshold V_diff is determined by the resistance value of the resistors R1 and R2, so that the hysteresis range is easily controlled by adjusting the values of the resistors R1 and R2, especially when the resistors R1 and R2 are variable resisters. According to the embodiments of the present invention, the hysteresis range is large enough to achieve sufficient stability of the output circuit.

Please note that in the above embodiment, the current supply system 30 includes two current sources 300 and 302, for detecting whether the first voltage V1 minus the second voltage V2 is greater than the threshold V_diff and whether the second voltage V2 minus the first voltage V1 is greater than the threshold V_diff. In another embodiment, a current supply system may include only one current source, for detecting the difference between two voltages in only one direction. For example, the current supply system may only need to detect whether the output voltage of an LDO regulator has a drop due to an increasing load, and determine whether to supply a larger output current to the control circuit of the LDO regulator accordingly. In such a condition, only one current source is required to detect the decreasing of the output voltage of the LDO regulator.

To sum up, the present invention provides a current source and a current supply system with a satisfactory hysteresis performance and a wider adaptive range. The hysteresis effect is realized by serially connecting a resistor to the tail current transistor and connecting the bulk terminals of the transistors in the differential pair to different terminals of the resistor. In such a condition, the hysteresis characteristics may be controlled easily by varying the resistance value of the resistor, and the possible hysteresis range is much larger than the conventional hysteresis generated from different width/length ratios in the differential pair, so that the current source and the current supply system of the present invention may output a stable current in normal operations; this achieves a higher stability of the output circuit. In addition, the bulk terminals are biased in the tail current branch, and no redundant voltage source is required, so that the current source is adaptive to different levels of the received voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current source with hysteresis for an output circuit, comprising:

a first tail current transistor, for supplying a first current to the output circuit;
a first resistor, coupled to a drain terminal of the first tail current transistor; and
a first differential pair, coupled to the first resistor, for controlling a magnitude of the first current supplied to the output circuit, the first differential pair comprising:
a first transistor, of which a bulk terminal is coupled to a terminal of the first resistor; and
a second transistor, of which a bulk terminal is coupled to another terminal of the first resistor;
wherein the first resistor is a variable resistor and a resistance value of the variable resistor is controlled to adjust a hysteresis effect of the current source.

2. The current source of claim 1, wherein a gate terminal of the first transistor receives a first voltage of the output circuit, and a gate terminal of the second transistor receives a second voltage of the output circuit.

3. The current source of claim 1, further comprising:
a second tail current transistor, for supplying a second current to the output circuit;
a second resistor, coupled to a drain terminal of the second tail current transistor; and
a second differential pair, coupled to the second resistor, for controlling a magnitude of the second current supplied to the output circuit, the second differential pair comprising:
a third transistor, of which a bulk terminal is coupled to a terminal of the second resistor; and
a fourth transistor, of which a bulk terminal is coupled to another terminal of the second resistor;
wherein a drain terminal of the third transistor is coupled to a drain terminal of the first transistor, and a drain terminal of the fourth transistor is coupled to a drain terminal of the second transistor.

4. The current source of claim 3, wherein a gate terminal of the first transistor and a gate terminal of the fourth transistor receive a first voltage of the output circuit, and a gate terminal of the second transistor and a gate terminal of the third transistor receive a second voltage of the output circuit.

5. The current source of claim 4, wherein the first voltage is an output voltage of the output circuit, and the second voltage is an input voltage of the output circuit.

6. The current source of claim 4, further comprising:
a first current mirror, coupled between the drain terminal of the first transistor, the drain terminal of the third transistor and the output circuit, for outputting a basic current to the output circuit by receiving the first current and the second current.

7. The current source of claim 6, further comprising:
a second current mirror, coupled between the drain terminal of the second transistor, the drain terminal of the fourth transistor and the output circuit, for outputting an additional current to the output circuit in addition to the basic current when a difference between the first voltage and the second voltage is greater than a threshold.

8. A current supply system with hysteresis, comprising:
an output circuit;
a first current source, comprising:
a first tail current transistor, for supplying a first current to the output circuit;
a first resistor, coupled to a drain terminal of the first tail current transistor; and
a first differential pair, coupled to the first resistor, for controlling a magnitude of the first current supplied to the output circuit, the first differential pair comprising:
a first transistor, of which a bulk terminal is coupled to a terminal of the first resistor, and a gate terminal receives a first voltage of the output circuit; and
a second transistor, of which a bulk terminal is coupled to another terminal of the first resistor, and a gate terminal receives a second voltage of the output circuit;
a second current source, comprising:
a second tail current transistor, for supplying a second current to the output circuit;
a second resistor, coupled to a drain terminal of the second tail current transistor; and
a second differential pair, coupled to the second resistor, for controlling a magnitude of the second current supplied to the output circuit, the second differential pair comprising:
a third transistor, of which a bulk terminal is coupled to a terminal of the second resistor, and a gate terminal receives the second voltage of the output circuit; and
a fourth transistor, of which a bulk terminal is coupled to another terminal of the second resistor, and a gate terminal receives the first voltage of the output circuit;
a first current mirror, coupled between a drain terminal of the first transistor, a drain terminal of the third transistor and the output circuit, for outputting a basic current to the output circuit by receiving the first current and the second current; and
a second current mirror, coupled between a drain terminal of the second transistor, a drain terminal of the fourth transistor and the output circuit, for outputting an additional current to the output circuit in addition to the basic current when a difference between the first voltage and the second voltage is greater than a threshold.

* * * * *